US009660182B2

(12) United States Patent
Sone et al.

(10) Patent No.: US 9,660,182 B2
(45) Date of Patent: May 23, 2017

(54) PLASMA PROCESSING METHOD AND PLASMA PROCESSING APPARATUS

(71) Applicant: Tokyo Electron Limited, Tokyo (JP)

(72) Inventors: Takashi Sone, Miyagi (JP); Daisuke Urayama, Miyagi (JP); Masato Kushibiki, Miyagi (JP); Nao Koizumi, Miyagi (JP); Wataru Kume, Beaverton, OR (US); Eiichi Nishimura, Miyagi (JP); Fumiko Yamashita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 92 days.

(21) Appl. No.: 14/387,655

(22) PCT Filed: Apr. 22, 2013

(86) PCT No.: PCT/JP2013/061806
§ 371 (c)(1),
(2) Date: Sep. 24, 2014

(87) PCT Pub. No.: WO2013/161769
PCT Pub. Date: Oct. 31, 2013

(65) Prior Publication Data
US 2015/0050750 A1 Feb. 19, 2015

Related U.S. Application Data

(60) Provisional application No. 61/642,685, filed on May 4, 2012.

(30) Foreign Application Priority Data

Apr. 26, 2012 (JP) ................................. 2012-101460

(51) Int. Cl.
B44C 1/22 (2006.01)
C03C 15/00 (2006.01)
(Continued)

(52) U.S. Cl.
CPC ........ *H01L 43/12* (2013.01); *H01J 37/32009* (2013.01); *H01J 37/32091* (2013.01);
(Continued)

(58) Field of Classification Search
CPC ........................ H01L 43/12; H01J 37/32568
(Continued)

(56) References Cited

U.S. PATENT DOCUMENTS 4,618,398 A * 10/1986 Nawata ............. H01L 21/32136
204/192.35
2003/0170985 A1* 9/2003 Hwang ................... B82Y 25/00
438/689
(Continued)

FOREIGN PATENT DOCUMENTS

JP 2009-530825 A 8/2009
WO 2007/109117 A2 9/2007
(Continued)

OTHER PUBLICATIONS

K. B. Jung et al., "Development of chemically assisted dry etching methods for magnetic device structures", Journal of Vacuum Science Technology, vol. 17, No. 6, of the Nov./Dec. 1999, pp. 3186 to 3189.*
(Continued)

Primary Examiner — Thomas Pham
(74) Attorney, Agent, or Firm — Pearne & Gordon LLP

(57) ABSTRACT

A plasma processing method of etching a multilayered material having a structure where a first magnetic layer 105 and a second magnetic layer 103 are stacked with an insulating layer 104 therebetween is performed by a plasma processing apparatus 10 including a processing chamber 12 where a processing space S is formed; and a gas supply unit 44 of supplying a processing gas into the processing space, and includes a first etching process where the first magnetic
(Continued)

layer is etched by supplying a first processing gas and generating plasma, and the first etching process is stopped on a surface of the insulating layer; and a second etching process where a residue Z is removed by supplying a second processing gas and generating plasma. The first magnetic layer and the second magnetic layer contain CoFeB, the first processing gas contains $Cl_2$, and the second processing gas contains $H_2$.

8 Claims, 14 Drawing Sheets

(51) Int. Cl.
    *C03C 25/68*     (2006.01)
    *C23F 1/00*     (2006.01)
    *H01L 43/12*     (2006.01)
    *H01J 37/32*     (2006.01)

(52) U.S. Cl.
    CPC .. *H01J 37/32165* (2013.01); *H01J 37/32568* (2013.01); *H01J 37/32807* (2013.01); *H01J 37/32825* (2013.01); *H01J 37/32834* (2013.01); *H01J 37/32908* (2013.01); *H01J 2237/18* (2013.01); *H01J 2237/327* (2013.01); *H01J 2237/3341* (2013.01)

(58) Field of Classification Search
    USPC .................................................. 216/67, 72
    See application file for complete search history.

(56) References Cited

U.S. PATENT DOCUMENTS

| | | |
|---|---|---|
| 2004/0137749 A1 | 7/2004 | Ying |
| 2005/0118353 A1* | 6/2005 | Chen ................. H01L 21/31122     427/569 |
| 2009/0283820 A1* | 11/2009 | Yaegashi ........... H01L 27/11565     257/324 |
| 2010/0046288 A1* | 2/2010 | Honjou ................... G11C 11/16     365/171 |

FOREIGN PATENT DOCUMENTS

| | | |
|---|---|---|
| WO | 2011/030529 A1 | 3/2011 |
| WO | 2011/048746 A1 | 4/2011 |

OTHER PUBLICATIONS

International Search Report for PCT/JP2013/061806 dated Jul. 9, 2013.

* cited by examiner

PLASMA PROCESSING METHOD AND PLASMA PROCESSING APPARATUS

CROSS-REFERENCE TO RELATED APPLICATION

This Application is a U.S. national phase application under 35 U.S.C. §371 of PCT Application No. PCT/JP2013/061806 filed on Apr. 22, 2013, which claims the benefit of Japanese Patent Application No. 2012-101460 filed on Apr. 26, 2012, and U.S. Provisional Application Ser. No. 61/642,685 filed on May 4, 2012, the entire disclosures of which are incorporated herein by reference.

TECHNICAL FIELD

The embodiments described herein pertain generally to a plasma processing method and a plasma processing apparatus.

BACKGROUND

In Patent Document 1, a kind of plasma processing method is described. In this plasma processing method, a MRAM device is manufactured by processing a multilayered object including a magnetic tunnel junction (MTJ) in which an insulating layer is interposed between a lower magnetic layer and an upper magnetic layer. In this method, $Al_2O_3$ is used as a material of the insulating layer. A magnetization direction of the lower magnetic layer is fixed, but a magnetization direction of the upper magnetic layer is changed by an external magnetic field. To be specific, in the method described in Patent Document 1, the MRAM device is manufactured by (a) forming a first mask on an upper electrode layer, (b) plasma-etching the upper electrode layer, the upper magnetic layer, and the insulating layer, (c) removing the first mask, (d) forming a second mask on the upper electrode layer, and (e) etching a lower electrode layer.

REFERENCES

Patent Document 1: Specification of U.S. Patent Application Publication No: US 2004/0137749

DISCLOSURE OF THE INVENTION

Problems to be Solved by the Invention

In an apparatus described in Patent Document 1, when the multilayered object is etched, a residue containing a conductive material may adhere to a side wall of the insulating layer. If the residue adheres to the side wall of the insulating layer, a leakage current is generated at the MTJ so that characteristics of the MRAM device are deteriorated. In order to solve such a problem, it is considered that the residue is suppressed from adhering to the side wall of the insulating layer by stopping the etching process on a top surface of the insulating layer. In the case of performing this method, it is necessary to increase etching selectivity between the magnetic layer and the insulating layer.

Meanwhile, it is known that if MgO is used as a material of the insulating layer of the MTJ device, a high MR ratio can be obtained. However, since MgO is a new material for the insulating layer of the MTJ device, there are not known etching conditions in which a high selectivity between the magnetic layer and the insulating layer made of MgO can be obtained. Therefore, in this technical field, there is a demand for stopping the etching process on the top surface of the insulating layer even when MgO is used for the insulating layer and improving the characteristics of the MRAM device by suppressing a leakage current from being generated.

Means for Solving the Problems

In one example embodiment, a plasma processing method of etching a multilayered material having a structure in which a first magnetic layer and a second magnetic layer are stacked with an insulating layer interposed therebetween is performed by using a plasma processing apparatus including a processing chamber in which a processing space for plasma generation is partitioned and formed; and a gas supply unit of supplying a processing gas into the processing space. The plasma processing method includes a first etching process in which the first magnetic layer is etched by supplying a first processing gas into the processing chamber and generating plasma, and the first etching process is stopped on a surface of the insulating layer; and a second etching process in which a residue produced in the first etching process is removed by supplying a second processing gas into the processing chamber and generating plasma. The first magnetic layer and the second magnetic layer contain CoFeB, the first processing gas contains $Cl_2$, and the second processing gas contains $H_2$.

In the plasma processing method in accordance with the example embodiment, in the first etching process, the first magnetic layer is etched by supplying the first processing gas containing $Cl_2$ and generating plasma, and then, the first etching process is stopped on the surface of the insulating layer. $Cl_2$ reacts with CoFeB contained in the first magnetic layer, but does not react with MgO contained in the insulating layer. Thus, etching selectivity between the magnetic layer containing CoFeB and the insulating layer containing MgO can be improved. Further, according to this plasma processing method, in the second etching process, the residue adhering to the side surfaces of the first magnetic layer and the top surface of the insulating layer is removed with the etching gas containing $H_2$. Thus, the verticality of the first magnetic layer is improved, and it is possible to suppress a residue from being dispersed and adhering to the side walls of the insulating layer when etching the insulating layer to be described later. Therefore, in accordance with the plasma processing method of the example embodiment, it is possible to improve characteristics of the MRAM device by suppressing the leakage current.

In the example embodiment, the second processing gas may further contain at least one of $N_2$, Ar, and He. In this case, it is possible to surely remove the residue adhering to the side surfaces of the first magnetic layer and the top surface of the insulating layer.

In the example embodiment, the plasma processing method may further include a coating process in which a surface of the multilayered material is coated with an insulating film after the second etching process. In this case, it is possible to surely suppress a residue from adhering to the side walls of the insulating layer in the subsequent process.

In the example embodiment, the plasma processing method may further include a third etching process in which the insulating layer and the second magnetic layer are etched by supplying a third processing gas into the processing chamber and generating plasma, after the coating process.

Further, the third processing gas may contain $CH_4$. In this case, the MRAM device can be manufactured from the multilayered material.

In the example embodiment, the plasma processing apparatus may further include a first electrode provided within the processing chamber; a second electrode provided to face the first electrode; a first power supply unit configured to apply a power having a first frequency to the first electrode; and a second power supply unit configured to apply a power having a second frequency to the second electrode. Further, the plasma may be generated within the processing chamber by applying a power having 1 MHz or less as the second frequency from the second power supply unit to the second electrode. In this case, since the power having the relatively low frequency is applied to the second electrode, the plasma is generated at a position spaced from the target object. Thus, the vertical movement of ions attracted by the second electrode is improved, and the verticality of the side wall of the target object can be improved accordingly.

In the example embodiment, the plasma may be generated within the processing chamber by applying a power having 400 kHz or less as the second frequency from the second power supply unit to the second electrode. In this case, since the power having the relatively low frequency of 400 kHz is applied to the second electrode, the plasma is generated at a position spaced from the target object. Thus, the verticality of the side wall of the multilayered material to be etched can be improved.

In the example embodiment, the plasma may be generated within the processing chamber by applying a power of 100 W to 300 W from the first power supply unit to the first electrode. In this case, since the relatively low power is applied to the first electrode, low-density plasma is generated at a lower limit of the margin of plasma ignition, and for example, the etched insulating layer or second magnetic layer can be discharged to the outside in the form of an organic metal complex having a large molecular structure.

In the example embodiment, the plasma processing apparatus may further include an exhaust unit configured to depressurize the processing space to a predetermined pressure level; and a control unit configured to control the exhaust unit. Further, the control unit may be configured to control the exhaust unit to set a pressure inside the processing space to be in a range of 10 mTorr to 30 mTorr (1.33 Pa to 4.00 Pa). In this case, since the pressure inside the processing space S is set to be low, a density of plasma generated in the processing space can be reduced. As a result, since an ion mean free path is lengthened, the verticality of the etching profile can be improved.

In the example embodiment, the processing space may have a gap of 20 mm to 30 mm. With this configuration, a sputtering effect can be increased, so than the exhaust for a low residence time (short staying time) can be promoted.

In another example embodiment, a plasma processing apparatus etches a multilayered material having a structure in which a first magnetic layer and a second magnetic layer are stacked with an insulating layer interposed therebetween. Here, the plasma processing apparatus includes a processing chamber in which a processing space for plasma generation is partitioned and formed; a gas supply unit configured to supply a processing gas into the processing space; and a control unit configured to control the gas supply unit. Further, under the control of the control unit, the first magnetic layer is etched by supplying a first processing gas into the processing chamber and generating plasma, and then, the etching is stopped on a surface of the insulating layer; and a residue produced in the etching with the first processing gas is removed by supplying a second processing gas into the processing chamber and generating plasma. Moreover, the first magnetic layer and the second magnetic layer contain CoFeB, the first processing gas contains $Cl_2$, and the second processing gas contains $H_2$.

In the plasma processing apparatus in accordance with the example embodiment, under the control of the control unit, the first magnetic layer is etched by supplying the first processing gas containing $Cl_2$ and generating plasma, and the etching is stopped on the surface of the insulating layer. $Cl_2$ reacts with CoFeB contained in the first magnetic layer, but does not react with MgO contained in the insulating layer. Thus, etching selectivity between the magnetic layer containing CoFeB and the insulating layer containing MgO can be improved. Further, under the control of the control unit, the residue adhering to the side surfaces of the first magnetic layer and the top surface of the insulating layer is removed with the etching gas containing $H_2$. Thus, the verticality of the first magnetic layer is improved, and it is possible to suppress a residue from being dispersed and adhering to the side walls of the insulating layer when etching the insulating layer to be described later. Therefore, in accordance with the plasma processing apparatus of the example embodiment, it is possible to improve characteristics of the MRAM device by suppressing the leakage current.

Effect of the Invention

In accordance with the example embodiments, it is possible to improve characteristics of the MRAM device by suppressing the leakage current.

MODE FOR CARRYING OUT THE INVENTION

Figure 1:
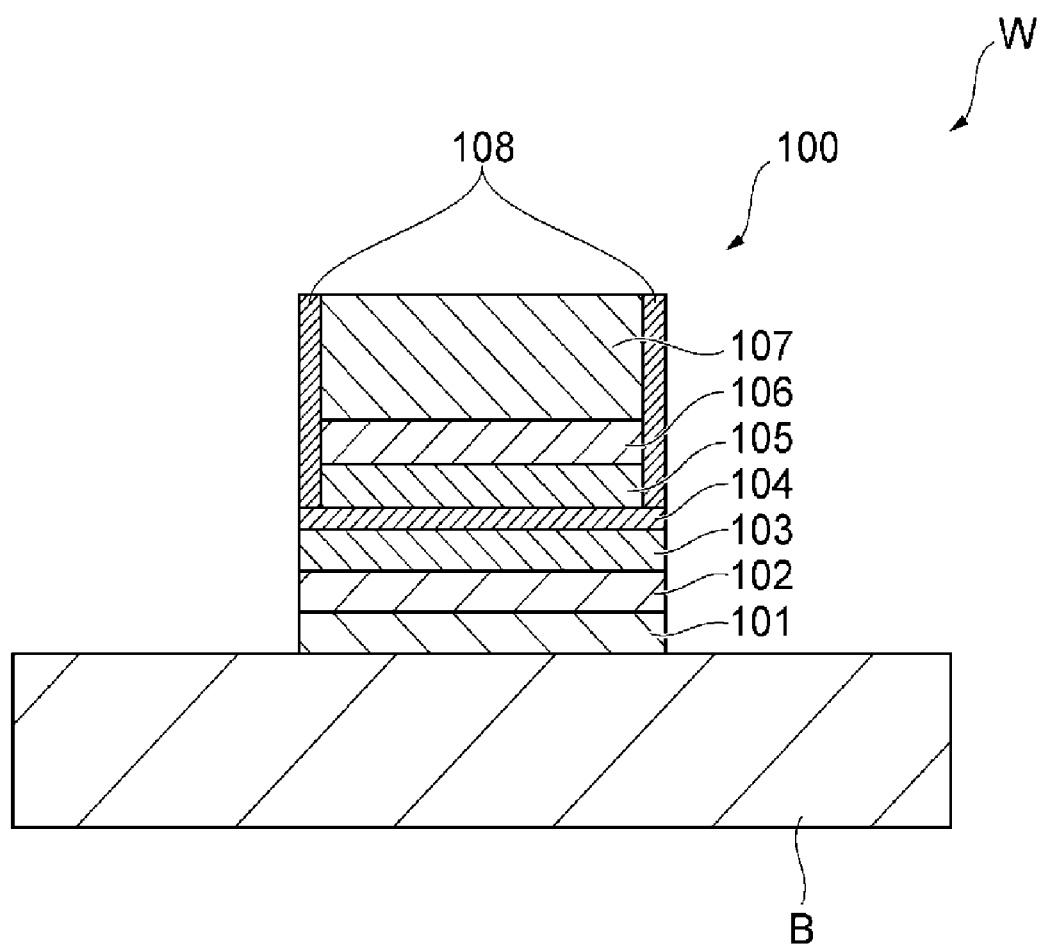
FIG. 1 is a diagram schematically showing an example of a MRAM device manufactured by a plasma processing method in accordance with an example embodiment.

Hereinafter, various example embodiments will be explained with reference to the accompanying drawings. Further, in the drawings, similar symbols typically identify similar components, unless context dictates otherwise.

FIG. 1 is a cross sectional view of a MRAM device 100 manufactured by a plasma processing method in accordance with an example embodiment. The MRAM device 100 depicted in FIG. 1 is provided on a substrate B and includes a lower electrode layer 101, a pinning layer 102, a second magnetic layer 103, an insulating layer 104, a first magnetic layer 105, an upper electrode layer 106, and an etching mask 107 stacked in sequence from the bottom. Further, an insulating film 108 is formed at side walls of the first magnetic layer 105, the upper electrode layer 106, and the etching mask 107 of the MRAM device 100.

The lower electrode layer 101 is formed on the substrate B as an electrode member having electrical conductivity. The lower electrode 101 has a thickness of, for example, about 5 nm. The pinning layer 102 is provided between the lower electrode layer 101 and the second magnetic layer 103. The pinning layer 102 is configured to fix a magnetization direction of the lower electrode layer 101 with a pinning effect caused by an antiferromagnetic material. The pinning layer 102 is made of an antiferromagnetic material such as IrMn (iridium manganese), PtMn (platinum manganese), etc., and has a thickness of, for example, about 7 nm.

The second magnetic layer 103 is provided on the pinning layer 102 and contains a ferromagnetic material. The second magnetic layer 103 functions as a so-called "pinned layer" of which a magnetization direction is maintained uniformly without being affected by an external magnetic field with the pinning effect caused by the pinning layer 102. The second magnetic layer 103 is made of CoFeB and has a thickness of, for example, about 2.5 nm.

The insulating layer 104 is interposed between the second magnetic layer 103 and the first magnetic layer 105. Since the insulating layer 104 is interposed between the second magnetic layer 103 and the first magnetic layer 105, a tunnel magnetoresistance is generated between the second magnetic layer 103 and the first magnetic layer 105. That is, between the second magnetic layer 103 and the first magnetic layer 105, an electrical resistance is caused by a relative relationship (parallel or antiparallel) between a magnetization direction of the second magnetic layer 103 and a magnetization direction of the first magnetic layer 105. The insulating layer 104 is made of MgO and has a thickness of, for example, 1.3 nm.

The first magnetic layer 105 is provided on the insulating layer 104 and contains a ferromagnetic material. The first magnetic layer 105 functions as a so-called "free layer" of which a magnetization direction can be changed in response to an external magnetic field as magnetic information. The first magnetic layer 105 is made of CoFeB and has a thickness of, for example, about 2.5 nm.

The upper electrode layer 106 is an electrode member which is formed on the substrate B and has electrical conductivity. The upper electrode layer 106 has a thickness of, for example, about 5 nm. The etching mask 107 is formed on the upper electrode layer 106. The etching mask 107 is formed in a shape according to a plane-view shape of the MRAM device 100. The etching mask 107 is made of, for example, Ta (tantalum), TiN (titanium nitride), etc., and has a thickness of, for example, 50 nm.

Figure 2:
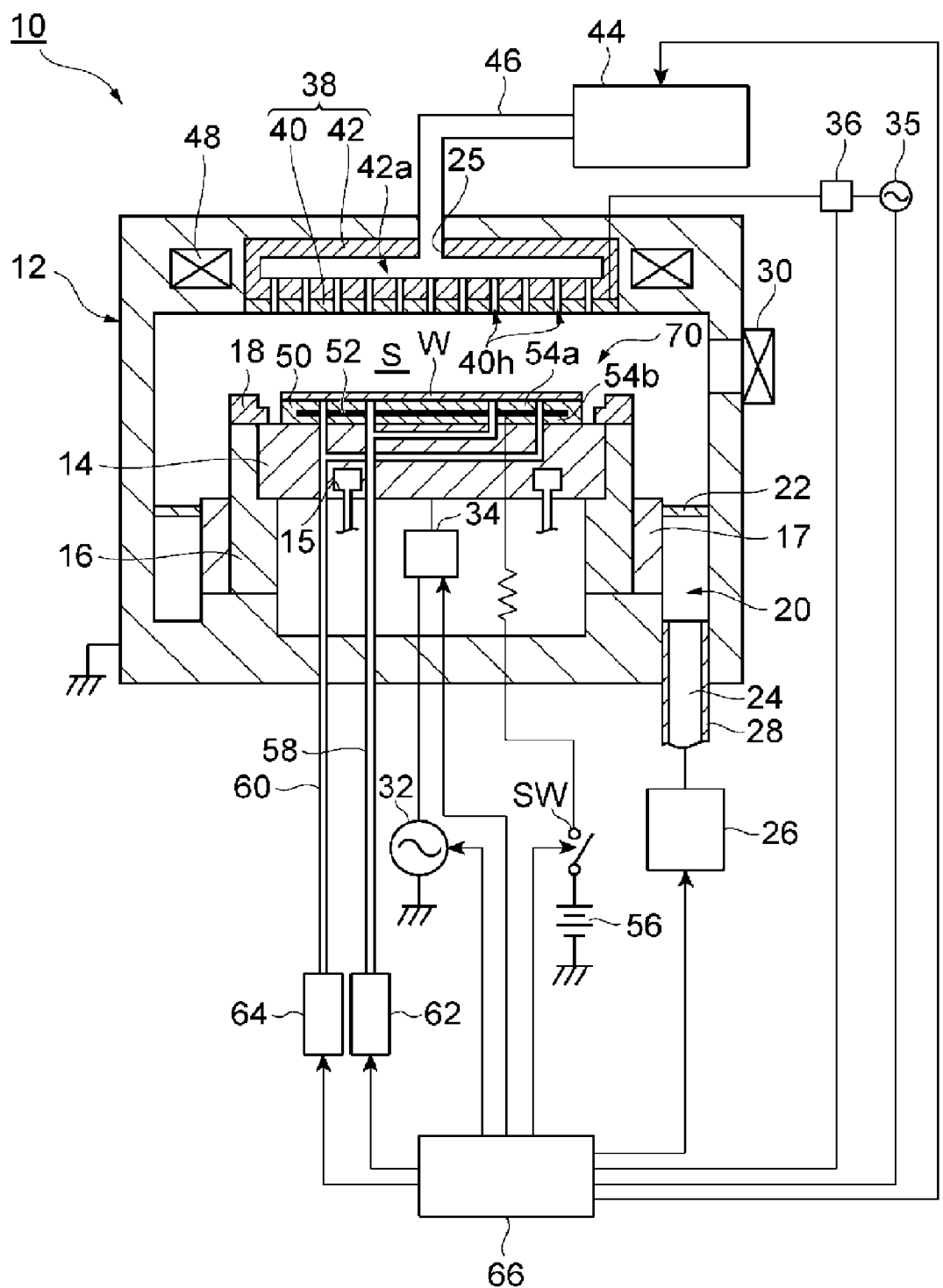
FIG. 2 is a cross sectional view showing a plasma processing apparatus in accordance with the example embodiment.

Here, a manufacturing method of the MRAM device 100 will be explained. The MRAM device 100 is manufactured by using a processing system including a plasma processing apparatus and a film forming apparatus. Hereinafter, the plasma processing apparatus will be explained in detail. FIG. 2 is a cross sectional view showing the plasma processing apparatus used for manufacturing the MRAM device 100.

A plasma processing apparatus 10 includes a processing chamber 12. The processing chamber 12 has a substantially cylindrical shape, and a processing space S is partitioned and formed as an inner space thereof. The plasma processing apparatus 10 includes a base 14 having a substantially circular plate shape within the processing chamber 12. The base 14 is provided under the processing space S. The base 14 is made of, for example, aluminum and serves as a second electrode. The base 14 is configured to absorb heat of an electrostatic chuck 50 to be described later to cool the electrostatic chuck 50 during a process.

Within the base 14, a coolant path 15 is formed. The coolant path 15 is connected with a coolant inlet line and a coolant outlet line. Further, the base 14 and the electrostatic chuck 50 can be controlled to have a preset temperature by circulating an appropriate coolant, for example, cooling water, through the coolant path 15.

In the example embodiment, the plasma processing apparatus 10 further includes a cylindrical holder 16 and a cylindrical supporting member 17. The cylindrical holder 16 is in contact with a side surface of the base 14 and a peripheral portion of a bottom surface of the base 14 to hold the base 14. The cylindrical supporting member 17 is vertically extended from a bottom portion of the processing chamber 12, and is configured to support the base 14 via the cylindrical holder 16. The plasma processing apparatus 10 further includes a focus ring 18 mounted on a top surface of the cylindrical holder 16. The focus ring 18 may be made of, for example, silicon or quartz.

In the example embodiment, an exhaust path 20 is formed between a side wall of the processing chamber 12 and the cylindrical supporting member 17. At an upper portion or at the middle portion of the exhaust path 20, a baffle plate 22 is provided. Further, at a bottom portion of the exhaust path 20, an exhaust opening 24 is formed. The exhaust opening 24 is partitioned and formed by an exhaust pipe 28 inserted into the bottom portion of the processing chamber 12. The exhaust pipe 28 is connected with an exhaust device (exhaust unit) 26. The exhaust device 26 includes a vacuum pump, and is configured to depressurize the processing space S within the processing chamber 12 to a preset vacuum level. At the side wall of the processing chamber 12, there is provided a gate valve 30 configured to open and close a loading/unloading opening for a target object (substrate) W.

The base 14 is electrically connected with a second high frequency power supply (second power supply unit) 32 for plasma generation via a matching unit 34. The second high frequency power supply 32 is configured to apply a high frequency power having a second frequency (for example, 400 kHz) to the second electrode, i.e., the base 14.

The plasma processing apparatus 10 further includes therein a shower head 38. The shower head 38 is provided above the processing space S. The shower head 38 includes an electrode plate 40 and an electrode supporting member 42.

The electrode plate 40 is a conductive plate having a substantially circular plate shape, and serves as a first electrode. The electrode plate 40 is electrically connected with a first high frequency power supply (first power supply unit) 35 for plasma generation via a matching unit 36. The first high frequency power supply 35 is configured to apply a high frequency power having a first frequency (for example, 60 MHz) to the electrode plate 40. When the high frequency powers are applied to the base 14 and the electrode plate 40 from the second high frequency power supply 32 and the first high frequency power supply 35, respectively, a high frequency electric field is generated in the space, i.e., the processing space S, between the base 14 and the electrode plate 40.

In the electrode plate 40, multiple gas discharge holes 40h are formed. The electrode plate 40 is detachably supported on the electrode supporting member 42. Within the electrode supporting member 42, a buffer room 42a is formed. The plasma processing apparatus 10 further includes a gas supply unit 44. A gas inlet opening 25 of the buffer room 42a is connected with the gas supply unit 44 via a gas supply line 46. The gas supply unit 44 is configured to supply a processing gas into the processing space S. The gas supply unit 44 can supply various kinds of etching gases. In the electrode supporting member 42, multiple holes respectively communicating with the multiple gas discharge holes 40h are formed. The multiple holes also communicate with the buffer room 42a. Therefore, a gas supplied from the gas supply unit 44 is introduced into the processing space S through the buffer chamber 42a and the gas discharge holes 40h. Further, in order to control a radical distribution, a flow rate $F_C$ of the processing gas at a central region of the target object W and a flow rate $F_E$ of the processing gas at a peripheral portion of the target object W may be controlled.

In the example embodiment, there is provided a magnetic field forming device 48 annularly or concentrically extended at a ceiling portion of the processing chamber 12. The magnetic field forming device 48 is configured to facilitate the start of the high frequency electric discharge (plasma ignition) in the processing space S and stably maintain the electric discharge.

In the example embodiment, the electrostatic chuck 50 is provided on a top surface of the base 14. The electrostatic chuck 50 includes an electrode 52 and a pair of insulating films 54a and 54b. The insulating films 54a and 54b are made of an insulating material such as ceramic. The electrode 52 is a conductive film, and is provided between the insulating film 54a and the insulating film 54b. The electrode 52 is connected with a DC power supply 56 via a switch SW. When a DC voltage is applied to the electrode 52 from the DC power supply 56, a Coulomb force is generated and the target object W is attracted to and held on the electrostatic chuck 50 by the Coulomb force. Within the electrostatic chuck 50, a heater as a heating member is embedded and configured to heat the target object W to a preset temperature. The heater is connected with a heater power supply via a wiring. The base 14 and the electrostatic chuck 50 serve as a mounting table 70.

In the example embodiment, the plasma processing apparatus 10 further includes gas supply lines 58 and 60 and heat transfer gas supply units 62 and 64. The heat transfer gas supply unit 62 is connected with the gas supply line 58. The gas supply line 58 is extended to a top surface of the electrostatic chuck 50 and annularly extended at a central region of the top surface. The heat transfer gas supply unit 62 is configured to supply a heat transfer gas such as a He gas between the top surface of the electrostatic chuck 50 and a rear surface of the target object W. Further, the heat transfer gas supply unit 64 is connected with the gas supply line 60. The gas supply line 60 is extended to the top surface of the electrostatic chuck 50 and annularly extended at the top surface to surround the gas supply line 58. The heat transfer gas supply unit 64 is configured to supply a heat transfer gas such as a He gas between the top surface of the electrostatic chuck 50 and the rear surface of the target object W.

In the example embodiment, the plasma processing apparatus 10 may further include a control unit 66. The control unit 66 is connected with the exhaust device 26, the switch SW, the second high frequency power supply 32, the matching unit 34, the first high frequency power supply 35, the matching unit 36, the gas supply unit 44, and the heat transfer gas supply units 62 and 64. The control unit 66 is configured to transmit a control signal to each of the exhaust device 26, the switch SW, the second high frequency power supply 32, the matching unit 34, the first high frequency power supply 35, the matching unit 36, the gas supply unit 44, and the heat transfer gas supply units 62 and 64. By the control signals from the control unit 66, an exhaust by the exhaust device 26, an opening and closing of the switch SW, a power supply from the second high frequency power supply 32, an impedance control by the matching unit 34, a power supply from the first high frequency power supply 35, an impedance control by the matching unit 36, a processing gas supply by the gas supply unit 44, and a heat transfer gas supply by each of the heat transfer gas supply units 62 and 64 are controlled.

In this plasma processing apparatus 10, a processing gas is supplied from the gas supply unit 44 into the processing space S. Further, between the electrode plate 40 and the base 14, i.e., in the processing space S, a high frequency electric field is generated. Thus, plasma is generated in the processing space S, and the target object W is etched with radicals of the element contained in the processing gas.

Figure 3:
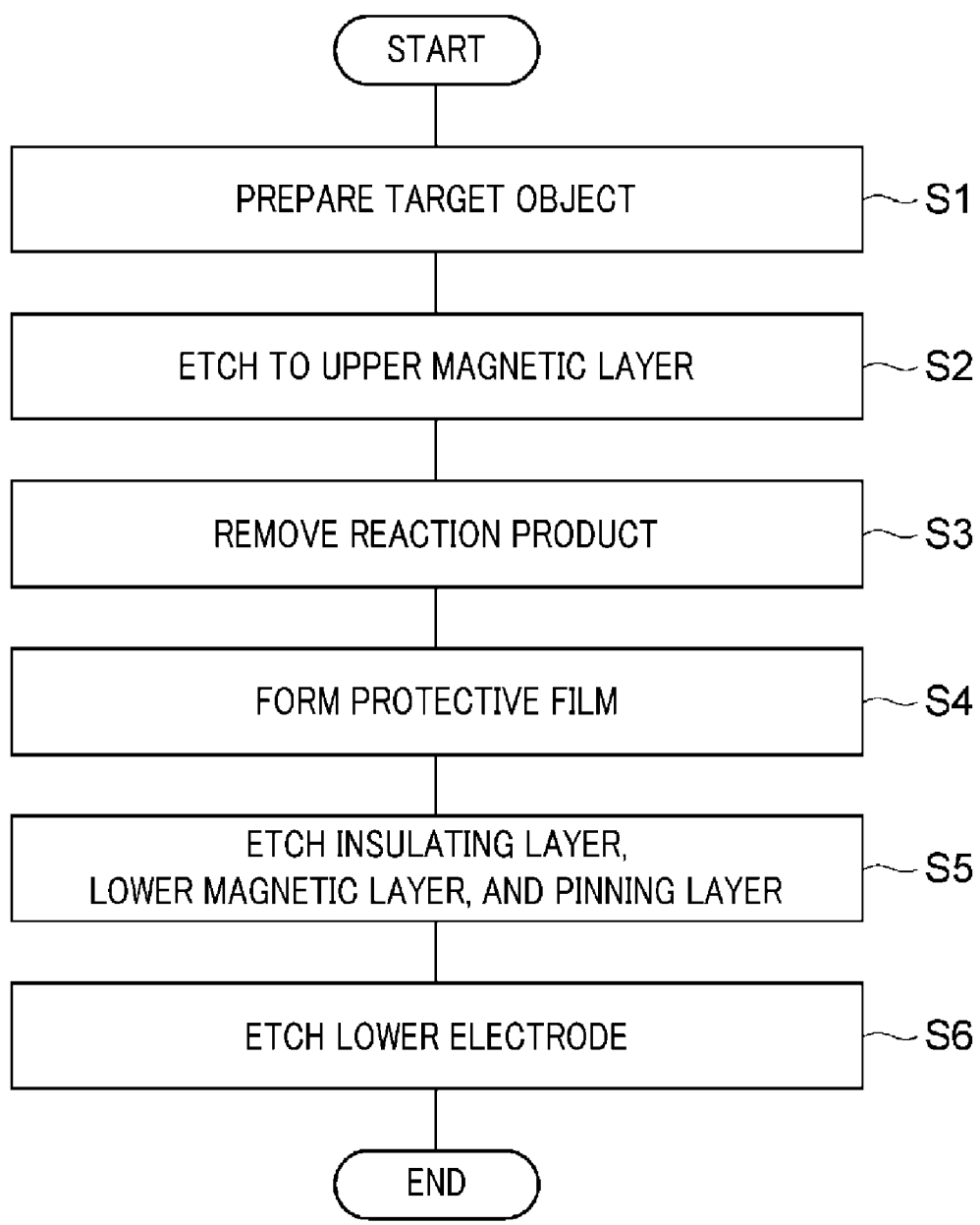
FIG. 3 is a flowchart showing the plasma processing method in accordance with the example embodiment.
Figure 4:
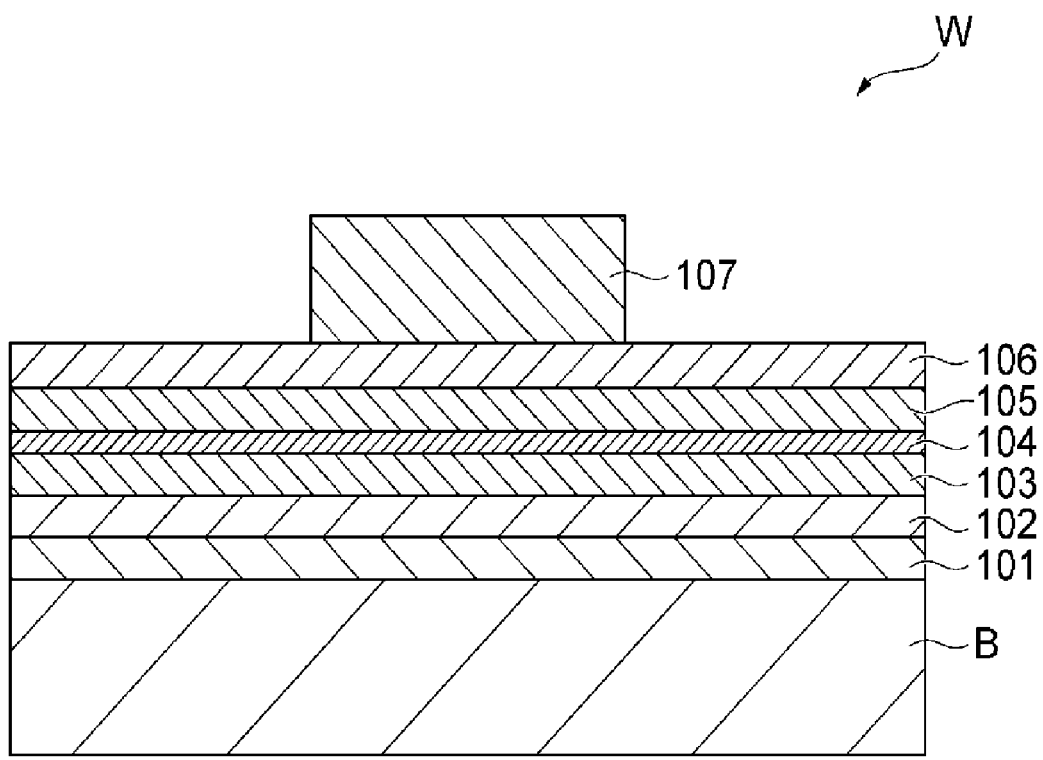
FIG. 4 shows a process of manufacturing the MRAM device using the plasma processing method in accordance with the example embodiment.

Hereinafter, a plasma processing method performed in the above-described plasma processing apparatus 10 will be explained. FIG. 3 is a flow chart showing a plasma processing method in accordance with the example embodiment. In the plasma processing method in accordance with the example embodiment, as depicted in FIG. 3, at block S1, the target object W is prepared and mounted on the electrostatic chuck 50 in the processing chamber 12. FIG. 4 shows an example of the target object W formed during the manufacturing process of the MRAM device 100. This target object W is a multilayered structure including the lower electrode layer 101, the pinning layer 102, the second magnetic layer 103, the insulating layer 104, the first magnetic layer 105, and the upper electrode layer 106 stacked on the substrate B. On the upper electrode layer 106, the etching mask 107 having a preset plane-view shape is formed. Hereinafter, the plasma processing method in accordance with the example embodiment using, for example, the target object W depicted in FIG. 4 will be explained.

At block S2 (First Etching Process), the upper electrode 106 is etched. Any etching gas can be used in this case. For example, $Cl_2$, $CH_4$, He, $N_2$, Ar, and the like may be used. Then, a first processing gas containing chlorine ($Cl_2$) is supplied into the processing chamber 12 from the gas supply unit 44 to generate plasma, and the target object W is etched. The first etching gas may further contain an inert gas such as He, $N_2$, and Ar, and $H_2$. At block S2, a region of the first magnetic layer 105 that is not covered by the etching mask 107 reacts with chlorine to be etched with the first processing gas. However, since MgO does not react with chlorine, the insulating layer 104 is not etched. Therefore, at block S2, the etching is stopped on a surface of the insulating layer 104.

At block S2, when the first magnetic layer 105 is etched with the first processing gas, a material to be etched reacts with the first processing gas, so that a by-product is produced. This by-product is produced from a reaction between CoFeB of the first magnetic layer 105 and $Cl_2$ contained in the first processing gas, as expressed by the following formula (1).

$$CoFeB + Cl_2 \rightarrow CoCl_2 \qquad (1)$$

Figure 5:
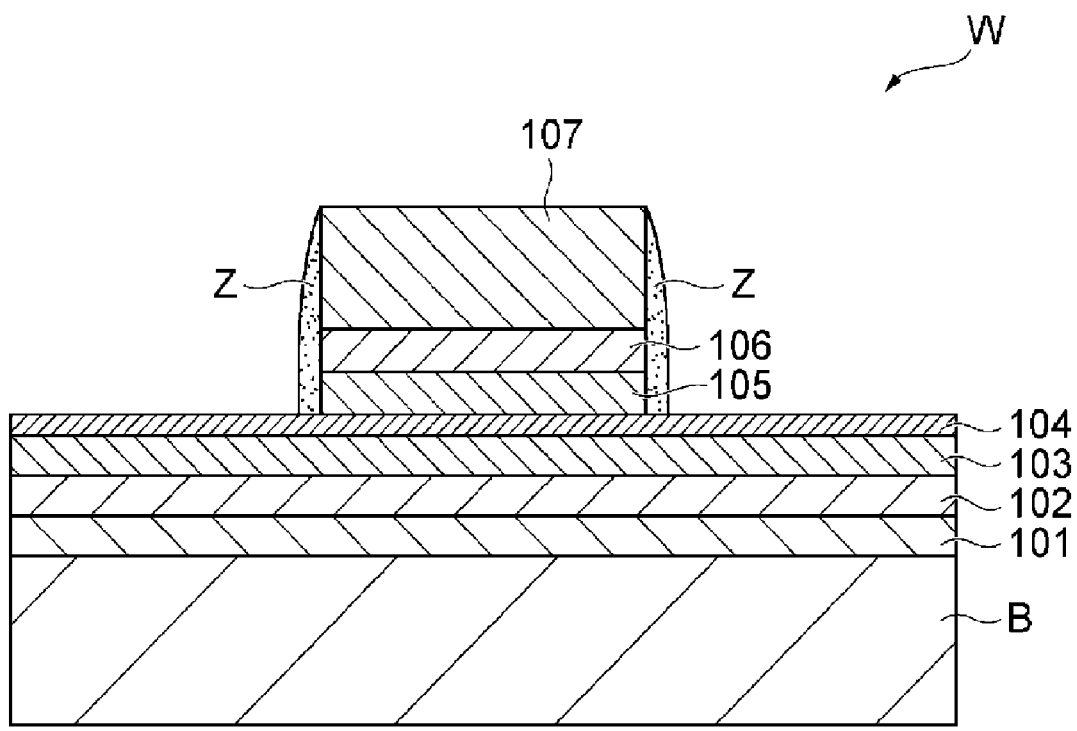
FIG. 5 shows a process of manufacturing the MRAM device using the plasma processing method in accordance with the example embodiment.

This by-product as a residue Z adheres to side walls of the first magnetic layer 105, the upper electrode layer 106, and the etching mask 107, as depicted in FIG. 5. Since the residue Z contains a conductive material, it may cause a leakage current in the MRAM device.

Hereinafter, there will be provided an example of processing conditions where the process of block S2 is carried out in the plasma processing apparatus 10.

(Block S2)
Pressure inside processing space S: 10 mTorr (1.33 Pa)
Power from first high frequency power supply 35: 100 W
Power from second high frequency power supply 32: 300 W
Flow rate of first processing gas
$N_2$ gas: 250 sccm
$Cl_2$ gas: 50 sccm
Radical distribution control (RDC) $F_C/F_E$: 50
Processing time: 10 seconds In the plasma processing method in accordance with the example embodiment, at subsequent block S3 (Second Etching Process), a second processing gas containing hydrogen ($H_2$) is supplied into the processing chamber 12 from the gas supply unit 44 to generate plasma, so that the residue Z produced at block S2 is removed. The second processing gas may further contain an inert gas such as He, $N_2$, and Ar.

At block S3, within the processing chamber 12, $CoCl_2$ in the residue Z and $H_2$ contained in the second processing gas make a reaction as expressed by the following formula (2).

$$CoCl_2 + H_2 \rightarrow HCl + Co \qquad (2)$$

Figure 6:
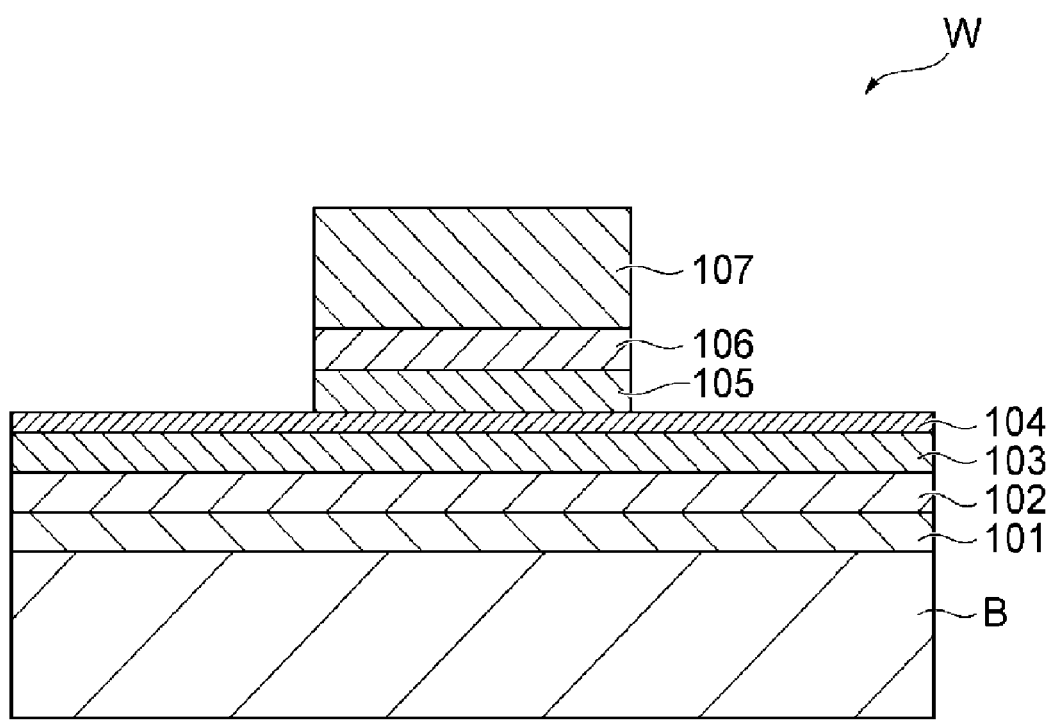
FIG. 6 shows a process of manufacturing the MRAM device using the plasma processing method in accordance with the example embodiment.

At block S3, as shown in the formula (2), $CoCl_2$ in the residue Z and $H_2$ contained in the second processing gas make a reaction, so that HCl and Co are produced. Among the products produced at block S3, HCl is volatilized to be discharged to the outside. Further, Co produced at block S3 has a porous shape and is sputtered with, for example, $N_2$ or Ar to be separated and removed. At block S3, as depicted in FIG. 6, the residue Z is removed from the side walls of the upper electrode layer 106, the first magnetic layer 105, and the etching mask 107.

Hereinafter, there will be provided an example of processing conditions where the process of block S3 is carried out in the plasma processing apparatus 10. In the following processing conditions, block S3 may be divided into two blocks S3A and S3B.

Figure 7:
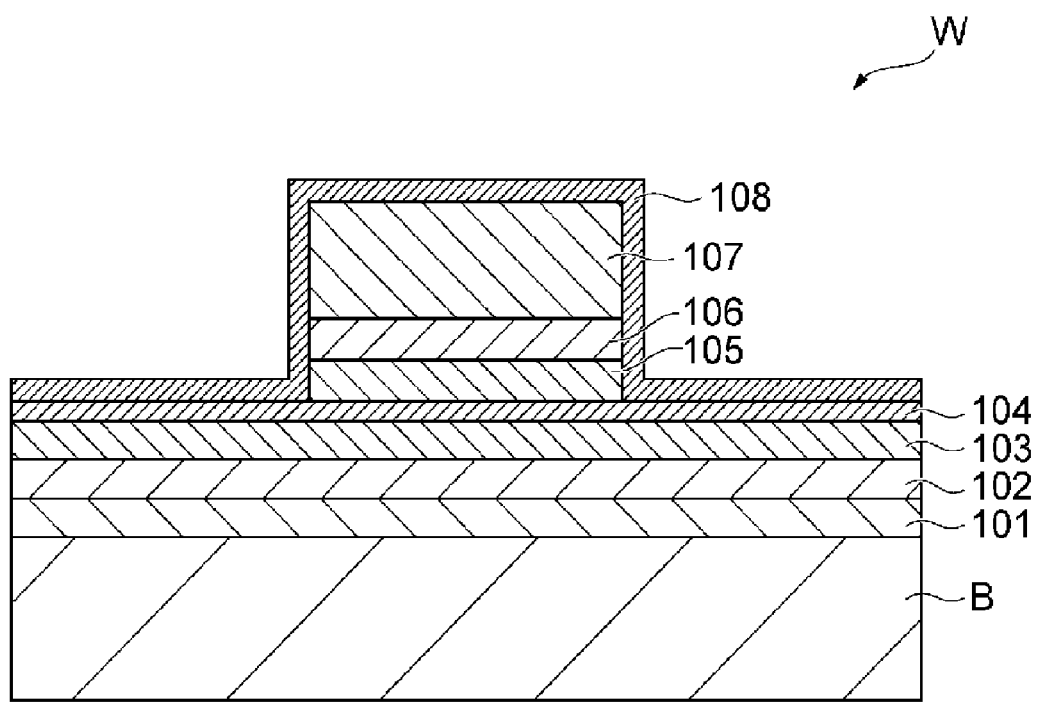
FIG. 7 shows a process of manufacturing the MRAM device using the plasma processing method in accordance with the example embodiment.

(Block S3A)
Pressure inside processing space S: 30 mTorr (4.00 Pa)
Power from first high frequency power supply 35: 200 W
Power from second high frequency power supply 32: 0 W
Flow rate of second processing gas
$H_2$ gas: 400 sccm
$N_2$ gas: 100 sccm
Radical distribution control (RDC) $F_C/F_E$: 50
Processing time: 2 seconds (Block S3B)
Pressure inside processing space S: 30 mTorr (4.00 Pa)
Power from first high frequency power supply 35: 200 W
Power from second high frequency power supply 32: 1000 W
Flow rate of second processing gas
$H_2$ gas: 400 sccm
$N_2$ gas: 100 sccm
Radical distribution control (RDC) $F_C/F_E$: 50
Processing time: 10 seconds In the plasma processing method in accordance with the example embodiment, at subsequent block S4 (Coating Process), as depicted in FIG. 7, a surface of the target object W is coated with the insulating film 108. By way of example, the target object W is transferred to a film forming apparatus (for example, RLSA apparatus or CVD apparatus) and the film is formed. This insulating film 108 may be formed by using, for example, SiN or $SiO_2$. Then, the target object W is returned to the plasma processing apparatus 10 depicted in FIG. 2, and the insulating film 108 is etched such that the insulating film 108 remains at the side walls of the first magnetic layer 105, upper electrode layer 106, and etching mask 107.

Figure 8:
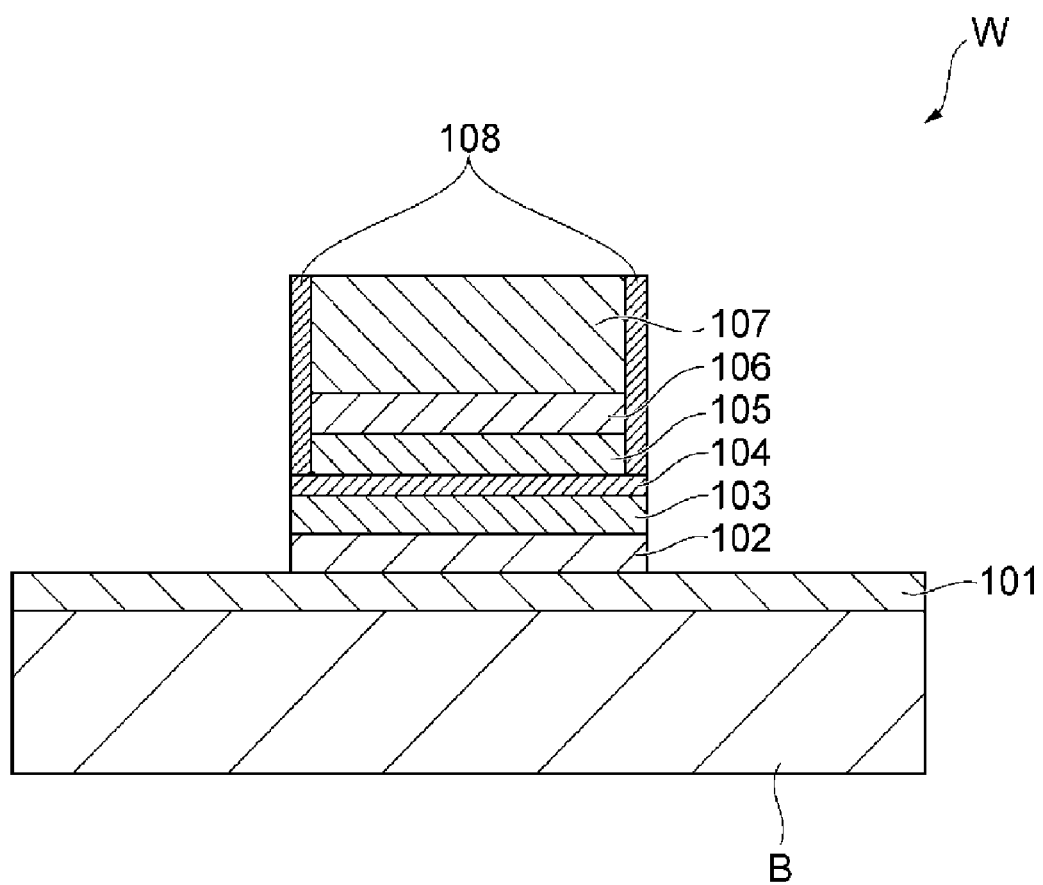
FIG. 8 shows a process of manufacturing the MRAM device using the plasma processing method in accordance with the example embodiment.

In the plasma processing method in accordance with the example embodiment, at subsequent block S5 (Third Etching Process), a third processing gas containing methane ($CH_4$) is supplied into the processing chamber 12 from the gas supply unit 44 to generate plasma, so that the insulating layer 104 and the second magnetic layer 103 are etched. Further, the pinning layer 102 may be etched together. The target object W etched at block S5 is illustrated in FIG. 8. The third processing gas may further contain other gases such as an inert gas including He, $N_2$, Ar or the like, or a gas containing a carbonyl group, $H_2$ or the like other than methane. At block S5, regions of the insulating layer 104, the second magnetic layer 103, and the pinning layer 102 that are not covered by the etching mask 107 and the insulating film 108 are etched with the third processing gas. In this case, a metal contained in the etching target layers becomes an organic metal to be volatilized and exhausted. Thus, the pinning layer 102, the second magnetic layer 103, and the insulating layer 104 are etched to have a width greater than that of the first magnetic layer 105, the upper electrode layer 106, and the etching mask 107 by a width of the insulating film 108 remaining at the side walls of the first magnetic layer 105, the upper electrode layer 106, and the etching mask 107.

Figure 9:
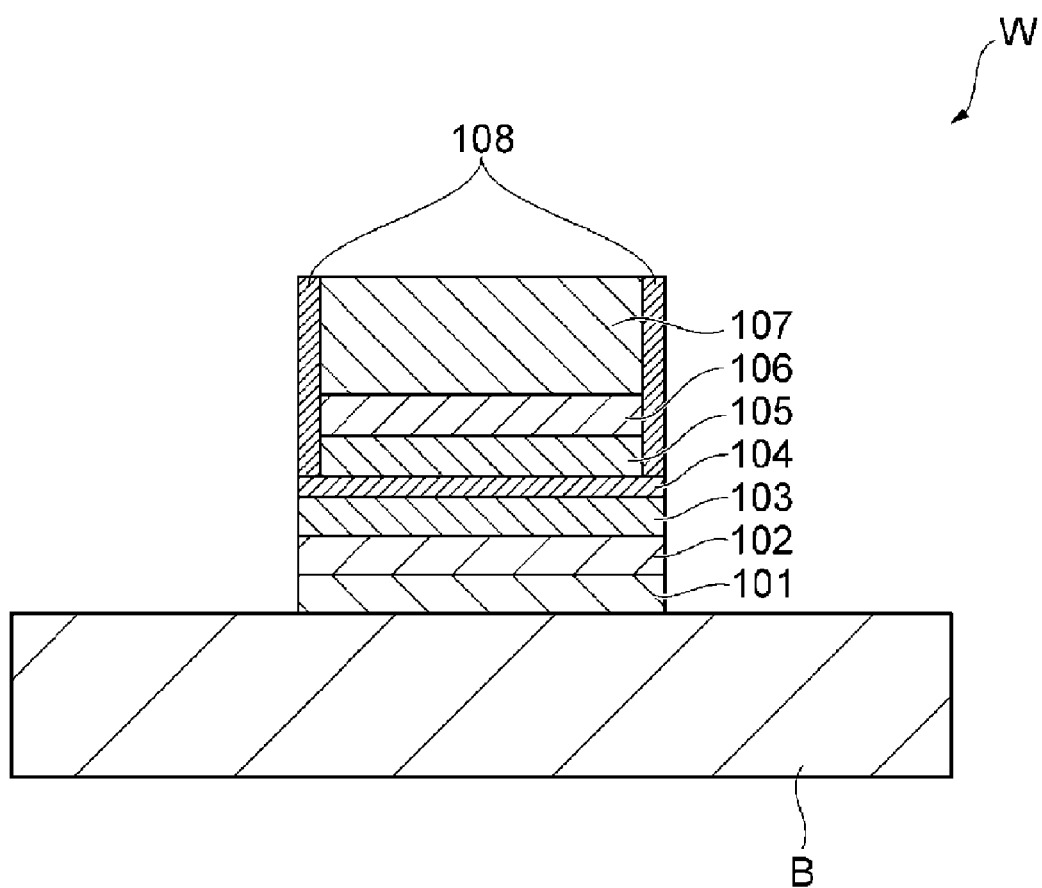
FIG. 9 shows a process of manufacturing the MRAM device using the plasma processing method in accordance with the example embodiment.

In the plasma processing method in accordance with the example embodiment, at subsequent block S6, a fourth processing gas is supplied into the processing chamber 12 from the gas supply unit 44 to generate plasma, so that the lower electrode layer 101 is etched. The target object W etched at block S6 is illustrated in FIG. 9. The fourth processing gas may be the same processing gas as the third processing gas. That is, the fourth processing gas may contain an inert gas such as He, $N_2$, Ar or the like, or a gas containing a carbonyl group, $CH_4$, and $H_2$. At block S6, a region of the lower electrode layer 101 that is not covered by the etching mask 107 and the insulating film 108 is etched with the fourth processing gas. In this case, a metal contained in the etching target layer becomes an organic metal to be volatilized and exhausted. Thus, the lower electrode layer 101 is etched to have the width greater than that of the first magnetic layer 105, the upper electrode layer 106, and the etching mask 107 by the width of the insulating film 108 remaining at the side walls of the first magnetic layer 105, the upper electrode layer 106, and the etching mask 107.

When the process of block S6 is ended, the plasma process depicted in FIG. 3 is ended. In this way, a MRAM device is manufactured in a desired shape from the target object W having a multilayered structure. Hereinafter, processing conditions where the plasma processing method is carried out in the plasma processing apparatus 10 will be explained in detail.

In the plasma processing method in accordance with the example embodiment, during the etching processes at blocks S2, S3, S5, and S6, a power having a frequency of 1 MHz or less as a second frequency may be applied from the second high frequency power supply 32 to the second electrode. In particular, a power having a frequency of 400 kHz or less as the second frequency may be applied from the second high frequency power supply 32 to the base 14. If a power having a relatively low frequency is applied to the base 14, plasma is generated at a relatively upper space of the processing space S, i.e., a position spaced from the target object W, as compared with a case of applying a power having a relatively high frequency to the base 14. Thus, a cathode drop voltage Vdc is increased, so that an ion can be vertically attracted by the second electrode. As a result, verticality of the etching profile is improved. Further, since plasma is not generated right above the target object W, it is possible to suppress dissociation of an organic metal complex separated from the target object W at blocks S5 and S6.

Further, in the plasma processing method in accordance with the example embodiment, during the etching processes at blocks S2, S3, S5, and S6, particularly, at blocks S5 and S6, the first high frequency power supply 35 may apply a power of 100 W to 300 W to the electrode plate 40 to generate plasma in the processing chamber 12. Thus, since the plasma is generated at a low dissociation region, the second magnetic layer 103 containing CoFeB can be plasma-etched to be exhausted in the form of an organic metal complex having a large molecular structure.

Furthermore, in the plasma processing method in accordance with the example embodiment, during the etching processes at blocks S2, S3, S5, and S6, a pressure inside the processing space S may be set to be 10 mTorr to 30 mTorr (1.33 Pa to 4.00 Pa). By setting the pressure inside the processing space S to be 30 mTorr (4.00 Pa) or less, a density of plasma generated in the processing space S can be reduced, and an ion mean free path can be lengthened. As a result, the verticality of the etching profile can be improved. Meanwhile, by setting the pressure inside the processing space S to be 10 mTorr (1.33 Pa) or more, appropriate etching selectivity between the insulating film 108 and the insulating layer 104 can be obtained.

Moreover, the plasma processing apparatus 10 configured to perform the plasma processing method in the example embodiment may have a gap of, for example, 20 mm to 30 mm. Herein, the term "gap" refers to a height of the processing space S partitioned and formed by the processing chamber 12. By using the plasma processing apparatus 10 having such a relatively small gap, a sputtering effect can be increased so that the exhaust for a low residence time can be promoted.

According to the plasma processing method explained above, in the first etching process, the first processing gas containing $Cl_2$ is supplied and plasma is generated, so that the first magnetic layer 105 is etched, and then, the etching process is ended on the surface of the insulating layer 104. Here, $Cl_2$ reacts with CoFeB contained in the first magnetic layer 105 but does not react with MgO contained in the insulating layer 104. Thus, the etching selectivity between the first magnetic layer 105 containing CoFeB and the insulating layer 104 containing MgO can be improved. Further, according to this plasma processing method, in the second etching process, the residue Z adhering to the side walls of the first magnetic layer 105 and the top surface of the insulating layer 104 is removed with the etching gas containing $H_2$. Thus, the verticality of the first magnetic layer 105 can be improved, and it is possible to suppress the residue Z from being dispersed and adhering to the side walls of the insulating layer 104 in the etching of the insulating layer 104 to be described later. Therefore, according to the plasma processing method in accordance with the example embodiment, it is possible to improve characteristics of the MRAM device 100 by suppressing the leakage current.

Further, since the second processing gas further contains at least one of $N_2$, Ar, and He, it is possible to surely remove the residue Z adhering to the side walls of first magnetic layer 105 and the top surface of the insulating layer 104.

Furthermore, since the plasma etching method further includes the coating process in which the surface of the target object W is coated with the insulating film 108 after the second etching process, it is possible to surely suppress the residue Z from adhering to the side walls of the insulating layer 104 in the subsequent process.

Moreover, since the plasma etching method further includes the third etching process in which the third processing gas containing $CH_4$ is supplied into the processing chamber 12 to generate plasma and the insulating layer 104 and the second magnetic layer 103 are etched after the coating process, it is possible to manufacture a MRAM device from the target object W.

Besides, the plasma processing apparatus 10 depicted in FIG. 2 includes the electrode plate 40 provided within the processing chamber 12; the base 14 provided to face the electrode plate 40; the first high frequency power supply 35 configured to apply the power of 60 MHz to the electrode plate 40; and the second high frequency power supply 32 configured to apply the power of 400 kHz to the base 14. In this plasma processing apparatus 10, the plasma is generated within the processing chamber 12 by applying the power having a frequency of 400 kHz from the second high frequency power supply 32 to the base 14. In this case, since the power having a relatively low frequency is applied to the base 14, the plasma is generated at a position spaced from the target object W. Thus, an ion can be vertically attracted by the base 14, so that the verticality of the side wall of the target object W can be improved accordingly.

In the plasma processing method, plasma is generated within the processing chamber 12 by applying a power of 100 W to 300 W from the first high frequency power supply 35 to the electrode plate 40. Therefore, since a relatively low power is applied to the electrode plate 40, low-density plasma is generated at a lower limit of the margin of plasma ignition, and for example, the etched insulating layer 104 or second magnetic layer 103 can be discharged to the outside in the form of an organic metal complex having a large molecular structure.

The plasma processing apparatus 10 further includes the exhaust device 26 configured to depressurize the processing space S to a desired pressure level; and the control unit 66 configured to control the exhaust device 26. In the plasma processing method, the control unit 66 controls the exhaust device 26 to set a pressure inside the processing space to be 10 mTorr to 30 mTorr (1.33 Pa to 4.00 Pa). By setting the pressure inside the processing space S to be low, the plasma density generated in the processing space S can be reduced, and the ion mean free path is lengthened, so that the verticality of the etching profile can be improved.

In the plasma processing method, the processing space S has the gap of 20 mm to 30 mm. Therefore, the sputtering effect can be increased, so that the exhaust for a low residence time (short staying time) can be promoted.

The present disclosure has been explained in detail with reference to the example embodiments. However, the present disclosure is not limited to the above example embodiments. The present disclosure can be modified and changed in various ways within the scope of the present disclosure.

By way of example, in the plasma processing apparatus 10 of the above example embodiment, the electrode plate 40 is provided at the upper portion of the plasma processing apparatus 10, and the first high frequency power supply 35 applies the high frequency power from above the processing space S. However, the electrode plate 40 may be provided at a lower portion of the plasma processing apparatus 10, and the first high frequency power supply 35 may apply the high frequency power from below the processing space S.

Further, the multilayered structure may include the lower electrode layer 101, the pinning layer 102, the second magnetic layer 103, the insulating layer 104, the first magnetic layer 105, the upper electrode layer 106, and the etching mask 107.

(Experimental Example)

Hereinafter, the present disclosure will be explained in more detail based on experimental examples and comparative examples, but the present disclosure is not limited to the experimental examples below.

(Observation of Etching Selectivity and Removal of Residue Z)

In a first experimental example, a target object W is etched with a first processing gas in the plasma processing apparatus 10 depicted in FIG. 2. The target object W used herein has a thickness of 70.8 nm from the top surface of the substrate B to the top surface of the insulating layer 104. Then, a surface of the target object W after the etching process is observed with an electron microscope. In the first experimental example, the etching process is divided into four sub-processes. Each of the four sub-processes is carried out under the following processing conditions.

Figure 10A:
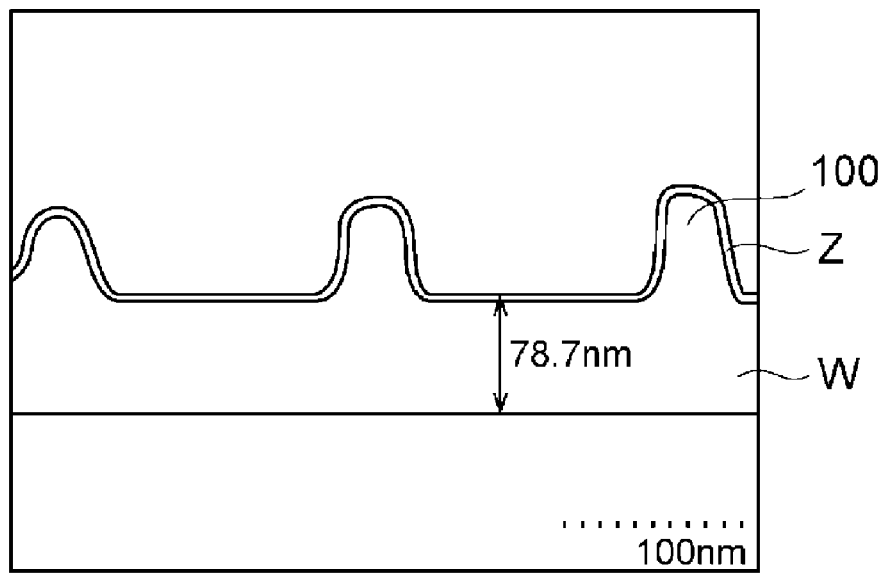
FIG. 10A and FIG. 10B are schematic diagrams of SEM images of target objects obtained from a first experimental example and a second experimental example, respectively.

(First Sub-Process)
Pressure inside processing space S: 30 mTorr (4.00 Pa)
Power from first high frequency power supply 35: 200 W
Power from second high frequency power supply 32: 0 W
Flow rate of first processing gas
$N_2$ gas: 200 sccm
$CH_4$ gas: 50 sccm
$Cl_2$ gas: 50 sccm
Radical distribution control (RDC) $F_C/F_E$: 50
Processing time: 2 seconds
(Second Sub-Process)
Pressure inside processing space S: 30 mTorr (4.00 Pa)
Power from first high frequency power supply 35: 200 W
Power from second high frequency power supply 32: 300 W
Flow rate of first processing gas
$N_2$ gas: 200 sccm
$CH_4$ gas: 50 sccm
$Cl_2$ gas: 50 sccm
Radical distribution control (RDC) $F_C/F_E$: 50
Processing time: 2 seconds
(Third Sub-Process)
Pressure inside processing space S: 20 mTorr (2.67 Pa)
Power from first high frequency power supply 35: 200 W
Power from second high frequency power supply 32: 300 W
Flow rate of first processing gas
$N_2$ gas: 200 sccm
$CH_4$ gas: 50 sccm
$Cl_2$ gas: 50 sccm
Radical distribution control (RDC) $F_C/F_E$: 50
Processing time: 70 seconds
(Fourth Sub-Process)
Pressure inside processing space S: 10 mTorr (1.33 Pa)
Power from first high frequency power supply 35: 100 W
Power from second high frequency power supply 32: 300 W
Flow rate of first processing gas
$N_2$ gas: 250 sccm
$Cl_2$ gas: 50 sccm
Radical distribution control (RDC) $F_C/F_E$: 50
Processing time: 10 seconds FIG. 10A provides a schematic diagram of a SEM image of the surface of the etched target object W in the first experimental example. As shown in FIG. 10A, it is observed that a residue Z adheres to the surface of the etched target object W in the first experimental example. In the first experimental example, the thickness of the etched target object W is 78.1 nm.

In a second experimental example, the target object W etched in the first experimental example is further etched with a second processing gas in the plasma processing apparatus 10 depicted in FIG. 2. Then, the surface of the target object W after the etching process is observed with the electron microscope. In the second experimental example, the etching process is divided into two sub-processes. Each of the two sub-processes is carried out under the following processing conditions.

Figure 10B:
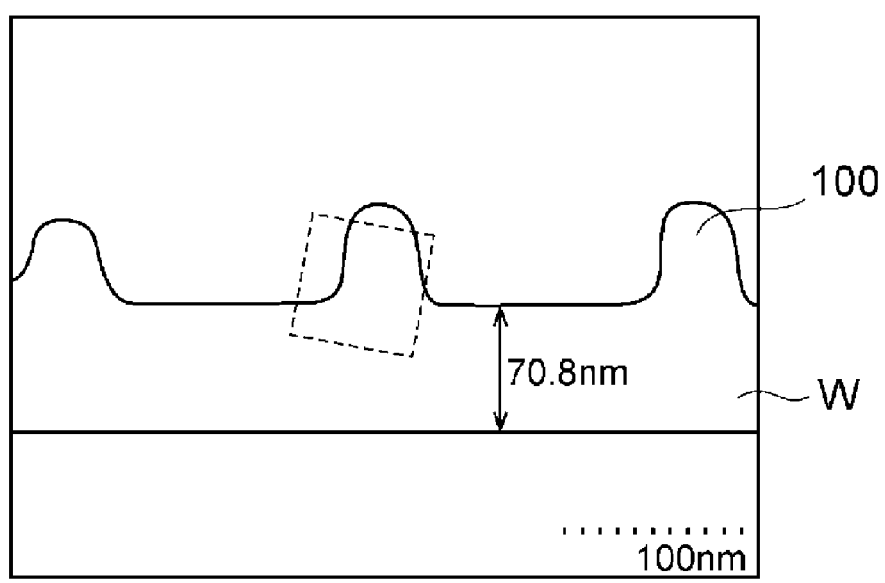
Figure 11:
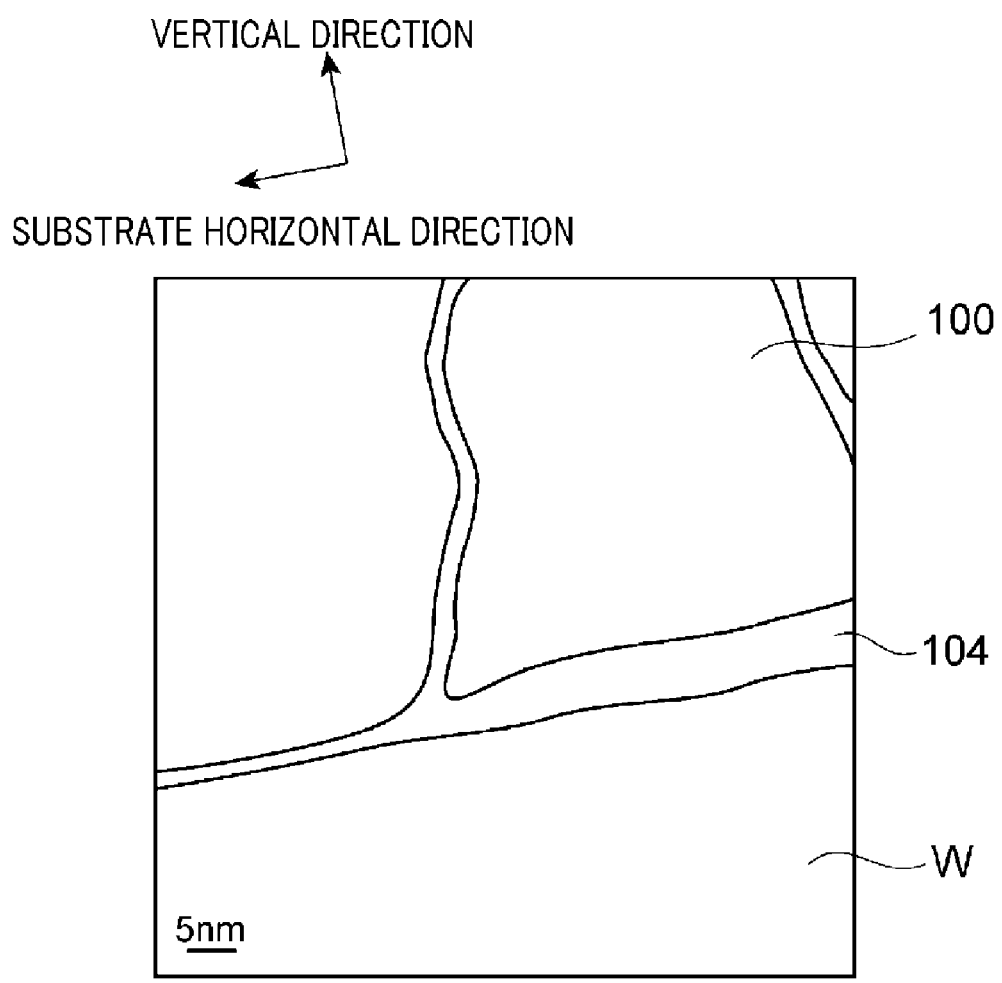
FIG. 11 is a schematic diagram of a TEM image of the target object obtained from the second experimental example.

(First Sub-Process)
Pressure inside processing space S: 30 mTorr (4.00 Pa)
Power from first high frequency power supply 35: 200 W
Power from second high frequency power supply 32: 0 W
Flow rate of second processing gas
$H_2$ gas: 400 sccm
$N_2$ gas: 100 sccm
Radical distribution control (RDC) $F_C/F_E$: 50
Processing time: 2 seconds
(Second Sub-Process)
Pressure inside processing space S: 30 mTorr (4.00 Pa)
Power from first high frequency power supply 35: 200 W
Power from second high frequency power supply 32: 1000 W
Flow rate of second processing gas
$H_2$ gas: 400 sccm
$N_2$ gas: 100 sccm
Radical distribution control (RDC) $F_C/F_E$: 50
Processing time: 10 seconds FIG. 10B provides a schematic diagram of a SEM image of the surface of the etched target object W in the second experimental example. Further, FIG. 11 is a schematic diagram of a TEM image of a region (which is indicated by a dotted line in FIG. 10B) of the MRAM device 100 obtained from the second experimental example. As shown in FIG. 10A and FIG. 11, it is observed that the residue Z is removed from the surface of the target object W in the second experimental example. In the second experimental example, the thickness of the etched target object W is 70.8 nm. Thus, it is confirmed that the etching process is stopped on the top surface of the insulating layer 104.

(Observation of Low-Bias Frequency Effect)

Hereinafter, there will be explained an experimental example in which the second frequency of the power supplied from the second high frequency power supply 32 is changed. In a third experimental example, an etching process is carried out in the plasma processing apparatus depicted in FIG. 2 by applying a power having a frequency of 60 MHz from the first high frequency power supply 35 to the electrode plate 40 and applying a power having a frequency of 400 kHz from the second high frequency power supply 32 to the base 14. In the third experimental example, a processing time is set to be 120 seconds. As an etching gas, a gas containing $H_2$, Ar, and $CH_4$ is used.

In a first comparative example, an etching process is carried out in the plasma processing apparatus depicted in FIG. 2 by applying a power having a frequency of 60 MHz from the first high frequency power supply 35 to the electrode plate 40 and applying a power having a frequency of 13 MHz from the second high frequency power supply 32 to the base 14. In the first comparative example, a processing time is set to be 100 seconds. The other processing conditions are the same as those of the third experimental example.

Figure 12A:
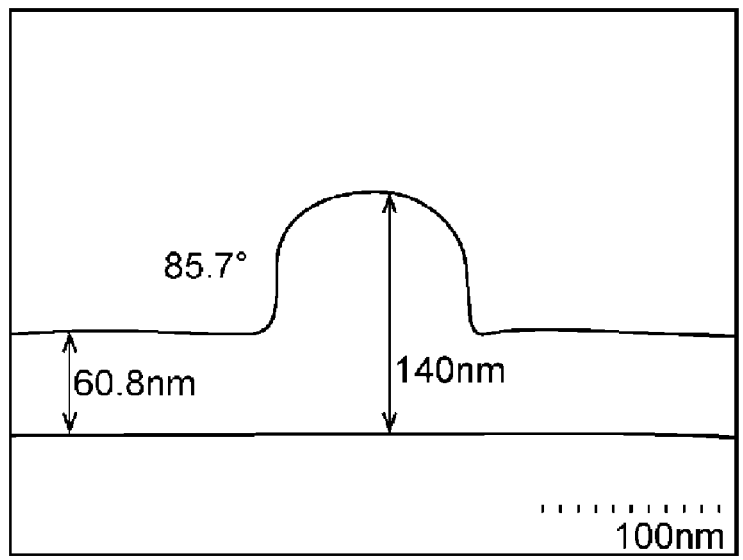
FIG. 12A and FIG. 12B are schematic diagrams of SEM images of target objects obtained from a third experimental example and a first comparative example, respectively.
Figure 12B:
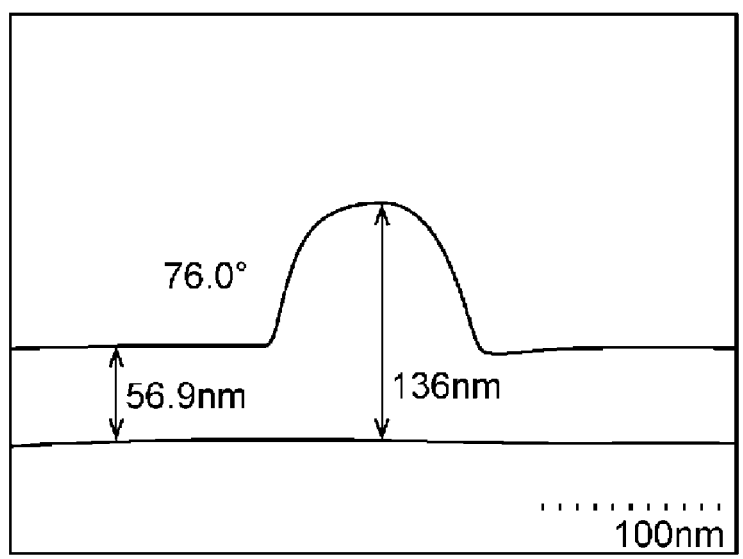

FIG. 12A and FIG. 12B are schematic diagrams of SEM images of surfaces of target objects W etched in the third experimental example and the first comparative example, respectively. As depicted in FIG. 12A, in the target object W of the third experimental example, a side wall of the MRAM device 100 has a taper angle of 85.7°. Further, the target object W in the third experimental example has a thickness of 60.8 nm and a height of 140 nm. Further, as depicted in FIG. 12B, in the target object W of the first comparative example, a side wall of the MRAM device 100 has a taper angle of 76.0°. Further, the target object W in the first comparative example has a thickness of 56.9 nm and a height of 136 nm. In this way, in the third experimental example in which the high frequency power having the second frequency of 400 kHz is applied, it is observed that the etching process can be carried out with higher verticality, as compared with the first comparative example in which the high frequency power having the second frequency of 13 MHz is applied, when being etched to have the substantially same height.

(Observation of Low-Pressure Effect)

Hereinafter, there will be explained an experimental example in which the pressure inside the processing space S is changed. In a fourth experimental example, the target object W is etched with the first processing gas and also etched with the second processing gas in the plasma processing apparatus 10 depicted in FIG. 2. Then, a surface of the target object W after the etching process is observed with the electron microscope. In the fourth experimental example, the etching process is divided into six sub-processes. Each of the six sub-processes is carried out under the following processing conditions.

(First Sub-Process)
Pressure inside processing space S: 30 mTorr (4.00 Pa)
Power from first high frequency power supply 35: 200 W
Power from second high frequency power supply 32: 0 W
Flow rate of first processing gas
$N_2$ gas: 200 sccm
$CH_4$ gas: 50 sccm
$Cl_2$ gas: 50 sccm
Radical distribution control (RDC) $F_C/F_E$: 50
Processing time: 2 seconds (Second Sub-Process)
Pressure inside processing space S: 30 mTorr (4.00 Pa)
Power from first high frequency power supply 35: 200 W
Power from second high frequency power supply 32: 300 W
Flow rate of first processing gas
$N_2$ gas: 200 sccm
$CH_4$ gas: 50 sccm
$Cl_2$ gas: 50 sccm
Radical distribution control (RDC) $F_C/F_E$: 50
Processing time: 2 seconds (Third Sub-Process)
Pressure inside processing space S: 20 mTorr (2.67 Pa)
Power from first high frequency power supply 35: 200 W
Power from second high frequency power supply 32: 300 W
Flow rate of first processing gas
$N_2$ gas: 200 sccm
$CH_4$ gas: 50 sccm
$Cl_2$ gas: 50 sccm
Radical distribution control (RDC) $F_C/F_E$: 50
Processing time: 70 seconds (Fourth Sub-Process)
Pressure inside processing space S: 10 mTorr (1.33 Pa)
Power from first high frequency power supply 35: 100 W
Power from second high frequency power supply 32: 300 W
Flow rate of first processing gas
$N_2$ gas: 250 sccm
$Cl_2$ gas: 50 sccm
Radical distribution control (RDC) $F_C/F_E$: 50
Processing time: 10 seconds (Fifth Sub-Process)
Pressure inside processing space S: 30 mTorr (4.00 Pa)
Power from first high frequency power supply 35: 200 W
Power from second high frequency power supply 32: 0 W
Flow rate of second processing gas
$H_2$ gas: 400 sccm
$N_2$ gas: 100 sccm
Radical distribution control (RDC) $F_C/F_E$: 50
Processing time: 2 seconds (Sixth Sub-Process)
Pressure inside processing space S: 30 mTorr (4.00 Pa)
Power from first high frequency power supply 35: 200 W
Power from second high frequency power supply 32: 1000 W
Flow rate of second processing gas
$H_2$ gas: 400 sccm
$N_2$ gas: 100 sccm
Radical distribution control (RDC) $F_C/F_E$: 50
Processing time: 20 seconds In a second comparative example, the target object W is etched under the same processing conditions as the fourth experimental example only except that a pressure inside the processing space S during the fourth sub-process is set to be 30 mTorr (4.00 Pa) and a processing time for the sixth sub-process is set to be 10 seconds.

Figure 13A:
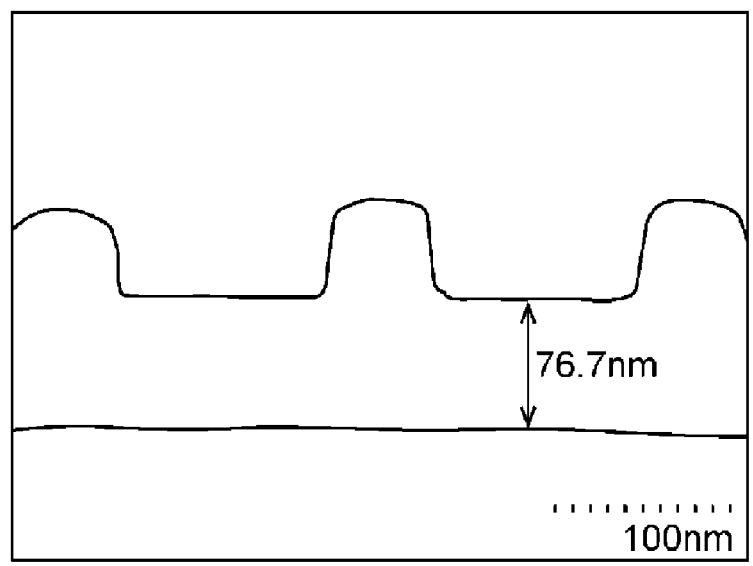
FIG. 13A and FIG. 13B are schematic diagrams of SEM images of target objects obtained from a fourth experimental example and a second comparative example, respectively.
Figure 13B:
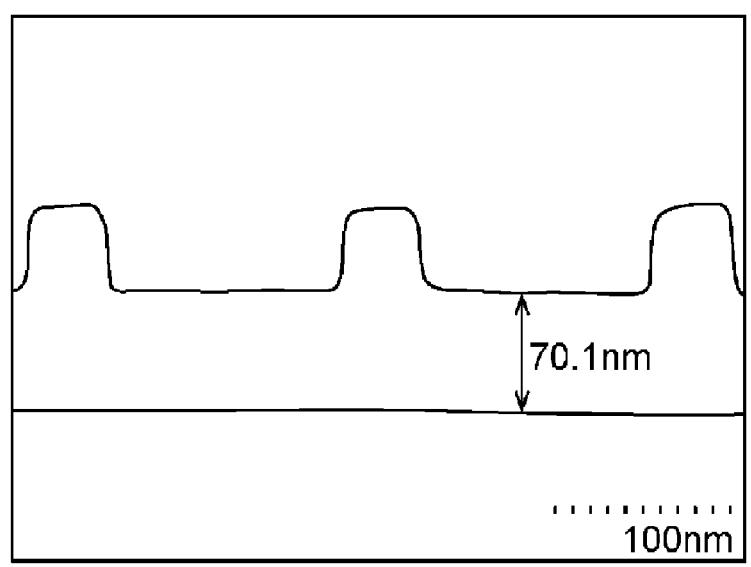
Figure 14:
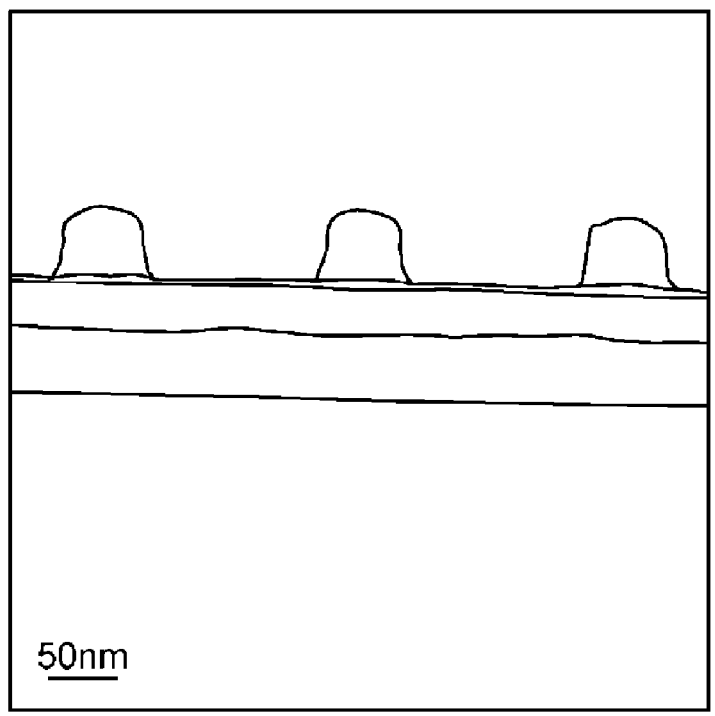
FIG. 14 is a schematic diagram of a TEM image of the target object obtained from the fourth experimental example.

FIG. 13A and FIG. 13B are schematic diagrams of SEM images of surfaces of the target objects W etched in the fourth experimental example and the second comparative example, respectively. FIG. 14 is a schematic diagram of a TEM image of the surface of the target object W etched in the fourth experimental example. As shown in FIG. 13A and FIG. 14, in the fourth experimental example, a thickness of the etched target object W is 76.7 nm. Further, as depicted in FIG. 13B, in the second comparative example, a thickness of the etched target object W is 70.1 nm. Furthermore, as depicted in FIG. 13B, in the second comparative example, it is observed that the MRAM device 100 becomes narrower toward the end portion thereof by the etching. In the fourth experimental example, it is observed that the MRAM device 100 does not become narrower toward the end portion thereof but has the higher verticality of the etching profile.

(Observation of Low-Gap Effect)

Hereinafter, there will be explained an experimental example in which the gap of the plasma processing apparatus 10 is changed. In a fifth experimental example, the target object W is etched in the plasma processing apparatus 10 having the gap of 25 mm. In the fifth experimental example, the target object W is etched under the following processing conditions.

Pressure inside processing space S: 6 mTorr (0.80 Pa)
Power from first high frequency power supply 35: 500 W
Power from second high frequency power supply 32: 100 W
Flow rate of processing gas
$CO_2$ gas: 34 sccm
$CH_4$ gas: 26 sccm
$H_2$ gas: 150 sccm
Ar gas: 50 sccm
He gas: 10 sccm
Radical distribution control (RDC) $F_C/F_E$: 50
Processing time: 600 seconds In a third comparative example, the target object W is etched in the plasma processing apparatus 10 having the gap of 35 mm. In the third comparative example, the target object W is etched under the following processing conditions.

Pressure inside processing space S: 6 mTorr (0.80 Pa)
Power from first high frequency power supply 35: 500 W
Power from second high frequency power supply 32: 100 W
Flow rate of processing gas
$CO_2$ gas: 30 sccm
$CH_4$ gas: 25 sccm
$H_2$ gas: 150 sccm
Ar gas: 50 sccm
He gas: 10 sccm
Radical distribution control (RDC) $F_C/F_E$: 50
Processing time: 600 seconds After performing the etching process under the above-described processing conditions, SEM images of the target objects W obtained from the fifth experimental example and the third comparative example are observed, and dimensions of the target objects W are measured. In the MRAM device 100 obtained from the fifth experimental example, a difference (CD) between a width of the first magnetic layer 105 and a width of the lower electrode layer 101 is 1.9 nm, and a difference (CD) between a width of the etching mask 107 and the width of the lower electrode layer 101 is 9.2 nm. Meanwhile, in the MRAM device 100 obtained from the third comparative example, a difference (CD) between a width of the first magnetic layer 105 and a width of the lower electrode layer 101 is 9.3 nm, and a difference (CD) between a width of the etching mask 107 and a width of the lower electrode layer 101 is 25.6 nm. As the CD decreases, the side wall of the MRAM device 100 is further vertically formed. Thus, in the fifth experimental example, it is observed that the residue Z is removed and the etching process is carried out with the higher verticality, as compared with the third comparative example.

EXPLANATION OF REFERENCE NUMERALS

10: Plasma processing apparatus
12: Processing chamber
14: Base (Second electrode)
26: Exhaust device
32: Second high frequency power supply (Second power supply unit)
35: First high frequency power supply (First power supply unit)
40: Electrode plate (First electrode)
100: MRAM device
101: Lower electrode layer
102: Pinning layer
103: Second magnetic layer
104: Insulating layer
105: First magnetic layer
106: Upper electrode layer
107: Etching mask
108: Insulating film
S: Processing space
W: Target object
Z: Residue

We claim:

1. A plasma processing method of etching a multilayered material having a structure in which a first magnetic layer and a second magnetic layer are stacked with an insulating layer interposed therebetween, by using a plasma processing apparatus including a processing chamber in which a processing space for plasma generation is partitioned and formed; and a gas supply unit of supplying a processing gas into the processing space, the plasma processing method comprising:

a first etching process in which the first magnetic layer is etched by supplying a first processing gas into the processing chamber and generating plasma, and the first etching process is stopped on a surface of the insulating layer;

a second etching process in which a residue produced in the first etching process is removed by supplying a second processing gas into the processing chamber and generating plasma;

a coating process in which a surface of the multilayered material is coated with an insulating film after the second etching process; and a third etching process in which the insulating layer and the second magnetic layer are etched by supplying a third processing gas into the processing chamber and generating plasma, after the coating process, wherein the first magnetic layer and the second magnetic layer contain CoFeB, the first processing gas contains $Cl_2$, the second processing gas contains $H_2$, the third processing gas contains $CH_4$, and the insulating layer contains MgO.

2. The plasma processing method of claim 1, wherein the second processing gas further contains at least one of $N_2$, Ar, and He.

3. The plasma processing method of claim 1, wherein the plasma processing apparatus further includes a first electrode provided within the processing chamber; a second electrode provided to face the first electrode; a first power supply unit configured to apply a power having a first frequency to the first electrode; and a second power supply unit configured to apply a power having a second frequency to the second electrode, and the plasma of the first processing gas and the plasma of the second processing gas are generated within the processing chamber by applying the second power having 1 MHz or less as the second frequency from the second power supply unit to the second electrode.

4. The plasma processing method of claim 3, wherein the plasma of the first processing gas and the plasma of the second processing gas are generated within the processing chamber by applying the second power having 400 kHz or less as the second frequency from the second power supply unit to the second electrode.

5. The plasma processing method of claim 1, wherein the plasma of the first processing gas and the plasma of the second processing gas are generated within the processing chamber by applying the first power of 100 W to 300 W from the first power supply unit to the first electrode.

6. The plasma processing method of claim 1, wherein the plasma processing apparatus further includes an exhaust unit configured to depressurize the processing space to a predetermined pressure level; and a control unit configured to control the exhaust unit, and the control unit is configured to control the exhaust unit to set a pressure inside the processing space to be in a range of 10 mTorr to 30 mTorr (1.33 Pa to 4.00 Pa).

7. The plasma processing method of claim 1, wherein the processing space has a gap of 20 mm to 30 mm.

8. The plasma processing method of claim 1, wherein the plasma processing apparatus further includes a first electrode provided within the processing chamber; a second electrode provided to face the first electrode; a first power supply unit configured to apply a first power having a first frequency to the first electrode; and a second power supply unit configured to apply a second power having a second frequency to the second electrode, and the second etching process includes: a first process in which only the first power is applied; and a second process in which both of the first power and the second power are applied.

* * * * *